US009685222B2

(12) United States Patent
Thomas et al.

(10) Patent No.: US 9,685,222 B2
(45) Date of Patent: Jun. 20, 2017

(54) MEMORY CELL WITH READ TRANSISTORS OF THE TFET AND MOSFET TYPE TO REDUCE LEAKAGE CURRENT

(71) Applicant: Commissariat A L'Energie Atomique et aux Energies Alternatives, Paris (FR)

(72) Inventors: Olivier Thomas, Revel (FR); Costin Anghel, Vanves (FR); Adam Makosiej, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/882,611

(22) Filed: Oct. 14, 2015

(65) Prior Publication Data

US 2017/0110179 A1    Apr. 20, 2017

(30) Foreign Application Priority Data

Oct. 17, 2014    (FR) ...................... 14 59985

(51) Int. Cl.
*G11C 11/00*    (2006.01)
*G11C 11/412*    (2006.01)
*G11C 11/419*    (2006.01)

(52) U.S. Cl.
CPC .......... *G11C 11/412* (2013.01); *G11C 11/419* (2013.01)

(58) Field of Classification Search
None
See application file for complete search history.

(56) References Cited

U.S. PATENT DOCUMENTS

| 8,320,163 | B2 | 11/2012 | Lee |
| 8,638,591 | B2 | 1/2014 | Saripalli et al. |
| 2012/0106236 | A1* | 5/2012 | Singh ................ G11C 11/412 365/154 |

OTHER PUBLICATIONS

U.S. Appl. No. 14/850,218, filed Sep. 10, 2015, Olivier Thomas et al.
French Preliminary Search Report issued Feb. 13, 2015 in French Application 14 59985, filed on Oct. 17, 2014 with (English Translation of Categories of Cited Documents).
J. Singh et al. "A Novel Si-Tunnel FET based SRAM Design for Ultra Low-Power 0.3V $V_{DD}$ Applications", Design Automation Conference (ASP-DAC), 2010, 6 pages.

(Continued)

*Primary Examiner* — Harry W Byrne
*Assistant Examiner* — Sultana Begum
(74) *Attorney, Agent, or Firm* — Oblon, McClelland, Maier & Neustadt, L.L.P.

(57) ABSTRACT

Memory cell of the SRAM type, including storage transistors forming a memory point for storing a bit and a read port having at least one MOS transistor, a TFET transistor, a power terminal and a read bit line whereof a potential is designed to vary depending on the value of the stored bit, and such that:
  the gate of the MOS transistor is connected to the memory point, and the gate of the TFET transistor is able to receive a read command signal;
  a first electrode of the MOS transistor is connected to the power supply terminal;
  a second electrode of the MOS transistor is connected to a first electrode of the TFET transistor;
  a second electrode of the TFET transistor is connected to the read bit line.

10 Claims, 7 Drawing Sheets

(56) References Cited

OTHER PUBLICATIONS

Xuebei Yang et al. "Robust 6T Si tunneling transistor SRAM design", Design, Automation & Test in Europe, Conference and Exhibition, IEEE, 2011, 6 pages.
S. Mookerjea et al. "Experimental Demonstration of 100nm Channel Length in $_{0.53}$Ga$_{0.47}$As-based Vertical Inter-band Tunnel Field Effect Transistors (TFETs) for Ultra Low-Power Logic and SRAM Applications", Electron Devices Meeting (IEDM), 2009, 3 pages.
Yoonmyung Lee et al. Low-Power Circuit Analysis and Design Based on Heterojunction Tunneling Transistors (HETTs), IEEE Transactions on Very Large Scale Integration (VLSI) Systems, vol. 21, No. 9, 2013, 12 pages.
Leland Chang et al. "Stable SRAM Cell Design for the 32nm Node and Beyond", Proc. Of Symposium on VLSI Technology, 2005, 2 pages.
Yin-Nien Chen et al. "A Comparative Analysis of Tunneling FET Circuit Switching Characteristics and SRAM Stability and Performance", Proc. Of European Solid State Devices Conference (ESSDERC), 2012, 4 pages.

* cited by examiner

MEMORY CELL WITH READ TRANSISTORS OF THE TFET AND MOSFET TYPE TO REDUCE LEAKAGE CURRENT

BACKGROUND OF THE INVENTION

The invention relates to the field of memory cells of the SRAM type.

A memory cell of the SRAM type generally include several CMOS storage transistors connected to one another while forming a bistable element made up of two inverters mounted head-to-tail (the output of the first inverter is connected to the input of the second inverter, and the output of the second inverter is connected to the input of the first inverter) and making it possible to store a bit.

Document [1] "Stable SRAM Cell Design for the 32 nm Node and Beyond" by L. Chang et al., Proc. Of Symposium on VLSI Technology, 2005, describes a memory cell of the SRAM type including eight CMOS transistors. Four of the eight CMOS transistors form the bistable element, two others of the eight CMOS transistors correspond to write access transistors and form a write port of the memory cell, and the last two CMOS transistors correspond to read access transistors and form a read port of the memory cell. A first of the two CMOS transistors of the read port includes its gate connected to the input of one of the two inverters of the bistable elements, its source connected to a reference potential, and its drain connected to the source of the second of the two CMOS transistors of the read port. The second of the two CMOS transistors of the read port includes its drain connected to a read bit line (on which a power supply potential $V_{DD}$ is applied prior to a read operation so that a current can flow through the two CMOS transistors of the read port during a read operation of the stored bit) and its gate connected to a read word line that makes it possible to command the beginning of the read operation via the application of a read command signal on that gate.

Such a read port nevertheless has the drawbacks of having significant leak currents, and does not make it possible to interleave bits between several interconnected memory cells. Furthermore, the electricity consumption of such a memory cell is high.

In order to reduce the electricity consumption of this type of memory cell, several documents propose using transistors of the TFET (Tunnel Field-Effect Transistor) type instead of CMOS transistors to produce memory cells of the SRAM type.

Document [2] "Low-Power Circuit Analysis and Design Based on Heterojunction Tunneling Transistors (HETTs)" by Y. Lee et al., Very Large Scale Integration (VLSI) Systems, IEEE Transactions on, vol. 21, no. 9, pp. 1632-1643, Sep. 9, 2013, describes the production of a memory cell of the SRAM type including four TFET transistors (two of type n and two of type p) with heterojunctions forming a bistable element. Two other TFET access transistors of type n are coupled to the bistable element, each including its drain connected to the input of one of the two inverters of the bistable element, and form the write port of the memory cell. Another TFET transistor of type n is used to form a read port separate from the write port.

However, such a memory cell has several drawbacks:
  low noise margins;
  significant leak currents at the write port and the read port;
  no possible interleaving of bits between several interconnected memory cells;
  limited current through the TFET transistor of the read port.

Document [3] "A Comparative Analysis of Tunneling FET Circuit Switching Characteristics and SRAM Stability and Performance" by Y.-N Chen et al., Proc. Of European Solid State Devices Conference (ESSDERC), 2012, describes a memory cell of the SRAM type close to that described in document [2], but the read port of which is formed by two TFET transistors of type n. A first of the two TFET transistors of the read port includes its gate connected to the input of one of the two inverters of the bistable element, its source connected to an electric reference potential, and its drain connected to the source of the second of the two TFET transistors of the read port. The second of the two TFET transistors of the read port has its drain connected to the read bit line and its gate connected to the read word line.

Such a memory cell also has several drawbacks, in particular:
  no possible interleaving of bits;
  limited read speed due to the two TFET transistors of the read port that are positioned along the discharge path of the read current from the read bit line to the reference electric potential.

BRIEF DESCRIPTION OF THE INVENTION

There is therefore a need to propose a new type of memory cell at least partially resolving the problems of the memory cells of the prior art previously described, and the read port of which allows quick reading of the state of the bit stored in the cell while reducing the leak currents.

To that end, one embodiment proposes a memory cell of the SRAM type, including at least:
  TFET and/or CMOS storage transistors forming a memory point at which a bit is designed to be stored;
  a read port comprising at least one MOS read transistor, a TFET read transistor, a power supply terminal and a read bit line whereof an electric potential is designed to vary depending on the value of the bit stored during a reading of the stored bit, and such that:
  the gate of the MOS read transistor is connected to the memory point, and the gate of the TFET read transistor is able to receive a read control signal of the stored bit;
  a first electrode of the MOS read transistor, corresponding to a source or a drain of the MOS read transistor, is connected to the power supply terminal;
  a second electrode of the MOS read transistor, respectively corresponding to the drain or the source of the MOS read transistor, is connected to a first electrode of the TFET read transistor corresponding to a source or a drain of the TFET read transistor;
  a second electrode of the TFET read transistor, respectively corresponding to the drain or the source of the TFET read transistor, is connected to the read bit line.

The joint use of a MOS transistor and a TFET transistor within the read port allows the memory cells to have small leak currents at the read port, since the presence of the TFET transistor in the path going from the read bit line to the power supply terminal makes it possible to greatly reduce these leak currents relative to a read port including only MOS transistors. This allows the memory cell to have an electricity consumption lower than that of the memory cells of the prior art. The low capacity formed by the TFET transistor that is connected to the read bit line also contributes to reduce the leak currents in the read port, without detriment to the read speed relative to a read port formed only by MOS transistors. The obtained read speed is also greater than that of a read port formed only from TFET transistors.

The transistors of the memory cell may be made with silicon or include one or more semiconductors other than silicon.

The first electrode of the MOS read transistor may correspond to the source of the MOS read transistor. In this configuration, the source of the MOS read transistor is connected to the power supply terminal, which allows a greater current to flow between the read bit line and the power supply terminal, and therefore makes it possible to obtain a greater read speed of the bit stored in the memory cell.

The memory cell may further include a polarizing means, or polarizing circuit, of the read port, and, when the MOS read transistor is of the n type, the means, or the circuit, for polarization of the read port may be able to apply a reference electric potential ($V_{SS}$, for example corresponding to a zero electric potential) on the power supply terminal (the power supply terminal being able to correspond to the ground in that case), or, when the MOS read transistor is of the p type, the means, or the circuit, for polarization of the read port may be able to apply a power supply potential ($V_{DD}$, for example corresponding to the positive electric potential electrically supplying the memory cell) on the power supply terminal.

The means, or the circuit, for polarizing the read port may be able to apply a reference electric potential on the power supply terminal such that during reading of the stored bit, a read current flows through the TFET read transistor and the MOS read transistor from the read bit line to the power supply terminal, or able to apply a power supply potential on the power supply terminal such that during reading of the stored bit, a read current flows through the MOS read transistor and the TFET read transistor from the power supply terminal to the read bit line.

The storage transistors may correspond to at least first and second TFET storage transistors connected to one another in series such that a connection between a first electrode of the first TFET storage transistor and a first electrode of the second TFET storage transistor forms the memory point, the first electrode of the first TFET storage transistor being able to correspond to its drain when the first TFET storage transistor is of type n or to its source when the first TFET storage transistor is of type p, the first electrode of the second TFET storage transistor being able to correspond to its source when the second TFET storage transistor is of type n or to its drain when the second TFET storage transistor is of type p;

the memory cell further being able to include means, or a circuit, for polarization of the first and second TFET storage transistors able to apply, on a second electrode of the second TFET storage transistor, which may correspond to its drain when its first electrode corresponds to its source or may correspond to its source when its first electrode corresponds to its drain, and on a second electrode of the first TFET storage transistor, which may correspond to its source when its first electrode corresponds to its drain or may correspond to its drain when its first electrode corresponds to its source, different electric potentials and such that irrespective of the value of an electric potential of the memory point, one of the first and second TFET storage transistors is polarized inversely and the other of the first and second TFET storage transistors is polarized with a substantially zero voltage $V_{DS}$.

Such a memory cell wisely uses the form of the static characteristics $I_{DS}(V_{DS})$ of the TFET storage transistors that are inversely polarized. Indeed, when the value of the electric potential of the memory point corresponds to a bit in the "0" state, the first TFET storage transistor is subject to a voltage $V_{DS1}$, between the drain and the source of the first TFET storage transistor, corresponding to an inverse polarization of the first TFET storage transistor, i.e., negative when the first TFET storage transistor is of type n or positive when the first TFET storage transistor is of type p, and the second TFET storage transistor is subjected to a voltage $V_{DS2}$, between the drain and the source of the second TFET storage transistor, which is substantially zero. Yet the static characteristic $I_{DS}(V_{DS})$ of an inversely polarized TFET transistor has a "bump" in the vicinity of $V_{DS}=0$ V. Thus, in the case of a bit in storage state "0", this bump of the characteristic $I_{DS}(V_{DS})$ of the second TFET transistor thus ensures stability at the electric potential value stored at the memory point of the memory cell. Likewise, when the value of the electric potential of the memory point corresponds to a bit in state "1", the voltage $V_{DS1}$ is substantially zero and the voltage $V_{DS2}$ corresponds to an inverse polarization of the second TFET storage transistor. In that case, the bump of the characteristic $I_{DS}(V_{DS})$ of the first TFET transistor ensures stability at the value of the electric potential stored at the memory point of the memory cell.

Furthermore, such a memory cell uses a smaller number of transistors than a memory cell including a bistable element formed by two inverters mounted head-to-tail, thus ensuring considerable compactness of the memory cell.

Furthermore, the inverse polarization operation of the TFET storage transistors makes it possible to have very low leak currents at the storage transistors.

Lastly, such a memory cell allows very fast reading and writing of the bit intended to be stored.

The two TFET storage transistors may be of type n or p, or one of the two TFET storage transistors may be of type n and the other of type p.

The means, or the circuit, for polarization of the first and second TFET storage transistors may be able to apply, on the second electrode of the second TFET storage transistor, a first electric potential with a value substantially equal to a first value of the electric potential of the memory point corresponding to a state "0" of the bit, and to apply, on the second electrode of the first TFET storage transistor, a second electric potential with a value substantially equal to a second value of the electric potential of the memory point corresponding to a state "1" of the bit.

The value of the first electric potential, or first value, may be equal to approximately 0 V, and/or the value of the second electric potential, or second value, may be between approximately 0.3 V and 1 V, or between approximately 0.3 V and 0.6 V.

The means, or the circuit, for polarization of the first and second TFET storage transistors and the first and second TFET storage transistors may be such that, when the value of the electric potential of the memory point is equal to that of the first electric potential, a value of a current $I_{DS1}$ crossing through the first TFET storage transistor is between approximately 1 fA/µm and 10 pA/µm (per µm of channel width) and such that, when the value of the electric potential of the memory point is equal to that of the second electric potential, a value of a current $I_{DS2}$ crossing through the second TFET storage transistor is between approximately 1 fA/µm and 10 pA/µm. The stability of the value of the electric potential stored at the memory point is still further improved by the fact that the static characteristics $I_{DS}(V_{DS})$ of the TFET storage transistors that are inversely polarized include, below a certain value of the voltage $V_{DS}$, a region having a differential negative resistance effect, and in the configuration above, these regions cooperate with the bumps of the static characteristics $I_{DS}(V_{DS})$ in order to ensure the stability of the value of the stored bit.

The means, or the circuit, for polarization of the first and second TFET storage transistors may be able to apply an electric potential $V_{GG1}$ on the gate of the first TFET storage transistor and an electric potential $V_{GG2}$ on the gate of the second TFET storage transistor such that:

when the first and second TFET storage transistors are of type n, the values of the electric potentials $V_{GG1}$ and $V_{GG2}$ are greater than or equal to those of the second electric potential, or greater than or equal to twice the value of the second electric potential, or between approximately 0.6 V and 2 V or between approximately 0.6 V and 1.2 V;

when the first TFET storage transistor is of type n and the second TFET storage transistor is of type p, the value of the electric potential $V_{GG1}$ is greater than or equal to that of the second electric potential, or greater than or equal to twice the value of the second electric potential, or between approximately 0.6 V and 2 V or between approximately 0.6 V and 1.2 V, and the value of the electric potential $V_{GG2}$ is less than or equal to 0;

when the first TFET storage transistor is of type p and the second TFET storage transistor is of type n, the value of the electric potential $V_{GG1}$ is less than or equal to 0 and the value of the electric potential $V_{GG2}$ is greater than or equal to that of the second electric potential, or greater than or equal to twice the value of the second electric potential, or between approximately 0.6 V and 2 V or between approximately 0.6 V and 1.2 V;

when the two TFET storage transistors are of type p, the value of the electric potential $V_{GG1}$ is less than or equal to 0 and the value of the electric potential $V_{GG2}$ is less than or equal to the opposite of that of the second electric potential.

For example, when the first and second TFET storage transistors are of type n, in a first configuration, the value of $V_{GG1}$ may be equal to the value of the second electric potential and the value of $V_{GG2}$ may be equal to twice the value of the second electric potential, and in a second configuration, the values of $V_{GG1}$ and $V_{GG2}$ may each be equal to twice the value of the second electric potential.

Alternatively, the storage transistors may correspond to at least four TFET and/or CMOS transistors connected to one another while forming a bistable element including two inverters mounted head-to-tail.

The memory cell may further include at least one MOS write transistor, of type n or p, whereof a first electrode, corresponding to its source or its drain, is connected to the memory point, whereof a second electrode, respectively corresponding to its drain or its source, is able to receive a data signal corresponding to the bit, and a gate of which is able to receive a write command signal in the memory cell.

Alternatively, the memory cell may further include at least:
  a first TFET write transistor whereof a first electrode, corresponding to its source when the first TFET write transistor is of type n or to its drain when the first TFET write transistor is of type p, is connected to the memory point, whereof a second electrode, corresponding to its drain when the first TFET write transistor is of type n or to its source when the first TFET write transistor is of type p, is able to receive a first data signal with a value corresponding to state "1" of the bit, and the gate of which is able to receive a first write command signal of the state "1" of the bit in the memory cell;
  a second TFET write transistor whereof a first electrode, corresponding to its drain when the second TFET write transistor is of type n or to its source when the second TFET write transistor is of type p, is connected to the memory point, whereof a second electrode, corresponding to its source when the second TFET write transistor is of type n or to its drain when the second TFET write transistor is of type p, is able to receive a second data signal with a value corresponding to state "0" of the bit, and the gate of which is able to receive a second write command signal of the state "0" of the bit in the memory cell.

Such an alternative has the advantage of allowing an interleaving of bits owing to the first and second write command signals used.

BRIEF DESCRIPTION OF THE DRAWINGS

The present invention will be better understood upon reading the description of example embodiments provided purely for information and non-limitingly and in reference to the appended drawings, in which.

Identical, similar or equivalent parts of the various figures described below bear the same numerical references so as to facilitate the passage from one figure to the next.

The different parts shown in the figures are not necessarily shown using a uniform scale, to make the figures more legible.

Different possibilities (alternatives and embodiments) must be understood as not being mutually exclusive and may be combined with one another.

DETAILED DESCRIPTION OF THE INVENTION

Figure 1:
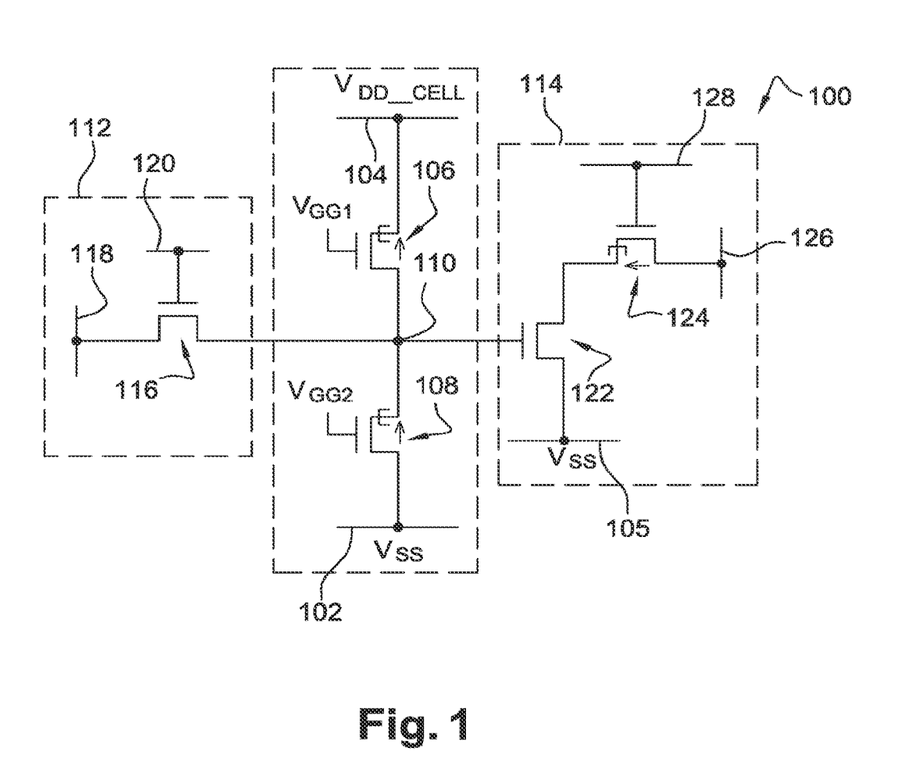
FIG. 1 diagrammatically shows a memory cell according to a first embodiment.

Reference will first be made to FIG. 1, which diagrammatically shows a memory cell 100 of the SRAM type according to a first embodiment.

The memory cell 100 includes a first power supply terminal 102 on which a first electric potential $V_{SS}$ is applied corresponding to a reference electric potential, for example equal to 0 V and able to correspond to a ground, and a second power supply terminal 104 on which a second electric potential $V_{DD\_CELL}$ corresponding to a power supply potential, which here is positive, is applied.

The memory cell 100 includes a first TFET storage transistor 106 and a second TFET storage transistor 108, here both of type n, connected in series to one another. Polarization means, or a polarization circuit, of the two TFET storage transistors 106 and 108, not visible in the figures and for example corresponding to means for generating electric voltages or an electric voltage generator, apply the desired electric potentials across the power supply terminals 102 and 104, as well as the desired electric potentials on the gates of the TFET storage transistors 106 and 108. The source of the first TFET storage transistor 106 is connected to the second power supply terminal 104 and the drain of the first TFET storage transistor 106 is connected to the source of the second TFET storage transistor 108. The drain of the second TFET storage transistor 108 is connected to the first power supply terminal 102.

A first electric gate potential $V_{GG1}$ is applied on the gate of the first TFET storage transistor 106 and a second electric gate potential $V_{GG2}$ is applied on the gate of the second TFET transistor 108. A memory point 110 of this memory cell 100 is located at the connection between the drain of the first TFET storage transistor 106 and the source of the second TFET storage transistor 108. The "1" or "0" state of the bit stored in the memory cell 100 corresponds to the value of the electric potential at that memory point 110.

The electric potentials $V_{SS}$ and $V_{DD\_CELL}$ applied across the power supply terminals 102 and 104 are such that the TFET storage transistors 106 and 108 are inversely polarized, or operate in inverse mode, i.e., such that the voltages $V_{DS}$ across the terminals of the drain and the source of each of the TFET storage transistors 106 and 108 are negative or zero. The potential $V_{DD\_CELL}$ applied on the second power supply terminal 104 is for example equal to approximately 0.6 V, and the potential $V_{SS}$ applied on the first power supply terminal 102 is an electric reference potential for example equal to approximately 0 V. With such potentials, a bit in state "1" stored in the memory cell 100 corresponds to an electric potential of approximately 0.6 V at the memory point 110, and a bit in state "0" corresponds to an electric potential of approximately 0 V at the memory point 110.

The static characteristic of a direct-polarized TFET transistor (electric potential applied on the drain greater than that applied on the source, i.e., for a positive voltage $V_{DS}$) is substantially similar to that of a MOS transistor with the same type of conductivity and directly polarized. However, the static characteristics of these two transistors differ in the case of an inverse polarization.

Figure 2:
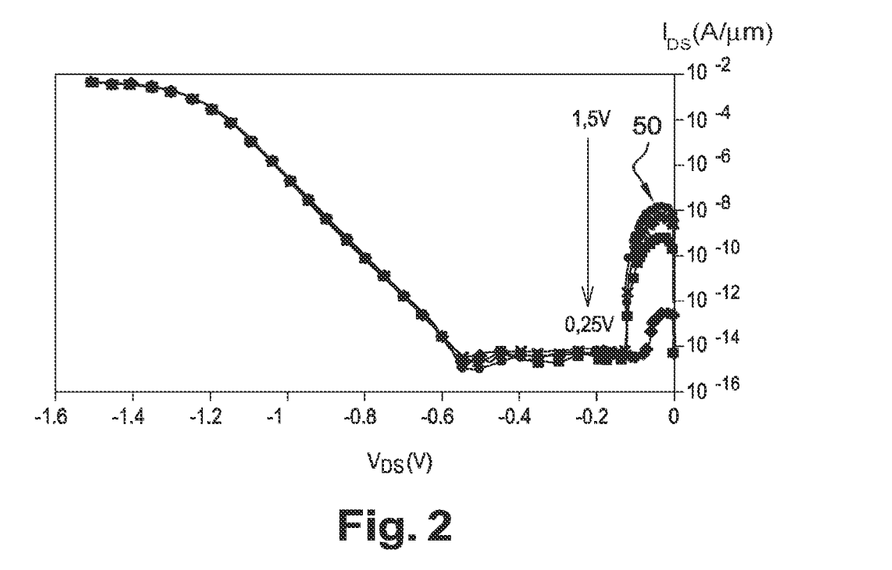
FIG. 2 shows the static characteristic $I_{DS}(V_{DS})$ of the n-type TFET transistor with inverse polarization.

FIG. 2 shows the static characteristic of an n-type TFET transistor made with silicon and inversely polarized (electric potential applied on the source greater than that applied on the drain, i.e., for a negative voltage $V_{DS}$) similar to the two TFET storage transistors 106 and 108 of the memory cell 100, this static characteristic corresponding to the current $I_{DS}$, in A/μm, as a function of the voltage $V_{DS}$, in volts, for different values of the potential $V_G$ applied on the gate of this TFET transistor (between 0.25 V and 1.5 V in FIG. 2). In FIG. 2, the y-axis ($I_{DS}$) is shown with a logarithmic scale.

For a negative voltage $V_{DS}$ comprised between 0 V and a first value equal to approximately −0.15 V or approximately −0.25 V, the curve followed by the current $I_{DS}$ forms a "bump" and the current $I_{DS}$ reaches, in that region, a maximum value 50 that is equal to the value when $V_{DS}$ is zero (approximately $10^{-14}$ A/μm in the example of FIG. 2) multiplied by a factor comprised between approximately $10^3$ and $10^7$ depending on the value of the voltage $V_G$. When the value of $V_{DS}$ is comprised between this first value and a second value lower than the first, between approximately −0.15 V and −0.6 V, or between approximately −0.25 V and −0.6 V, in the example of FIG. 2, the current $I_{DS}$ has a value substantially equal to that when $V_{DS}$ is zero. When the value of $V_{DS}$ is below that second value, the value of the current $I_{DS}$ increases (NDR, or negative differential resistance, effect) until it exceeds the maximum value referenced 50.

The "bump" formed by the characteristic $I_{DS}(V_{DS})$ of a negatively polarized TFET transistor for negative values of $V_{DS}$ and close to 0 is used here for the stability of the storage of the value of a bit in the memory cell 100. Indeed, given the series connection between the two TFET storage transistors 106 and 108, the current flowing at the memory point 110 and that also crosses through the two TFET storage transistors 106 and 108 depends on the characteristics $I_{DS}(V_{DS})$ of the two TFET storage transistors 106 and 108 inversely polarized.

The two characteristics $I_{DS}(V_{DS})$ of the two TFET storage transistors 106 and 108 are shown together in FIG. 3 as a function of the value of the electric potential $V_{110}$ at the memory point 110, and for a voltage $V_{DD\_CELL}$ with a value close or equal to the opposite second value of the characteristics $I_{DS}(V_{DS})$ of the TFET storage transistors 106 and 108 (the value below which the negative differential resistance phenomenon is obtained), for example approximately 0.6 V. The curve referenced 52 corresponds to the characteristic $I_{DS}(V_{DS})$ of the first TFET storage transistor 106. This curve 52 forms a "bump" referenced 54 when the value of the potential $V_{110}$ is close or equal to that of $V_{DD\_CELL}$ (which corresponds to zero $V_{DS1}$ between the drain and the source of the first TFET storage transistor 106), i.e., approximately 0.6 V in the example described here. The curve referenced 56 corresponds to the characteristic $I_{DS}(V_{DS})$ of the second TFET storage transistor 108, and forms a "bump" referenced 58 when the value of the potential $V_{110}$ is close or equal to that of $V_{SS}$ (which corresponds to zero $V_{DS2}$ between the drain and the source of the second TFET storage transistor 108), i.e., 0 V.

Figure 3:
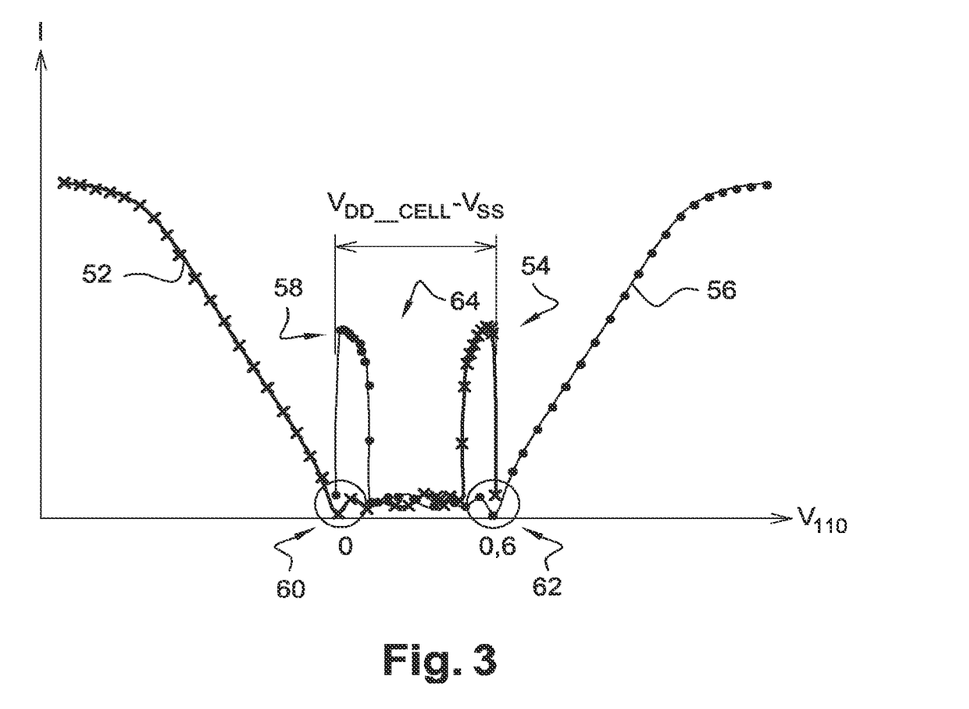
FIG. 3 shows the superposition of the static characteristics $I_{DS}(V_{DS})$ of two n-type TFET storage transistors with inverse polarization of a memory cell involved in the variation of the current crossing through the memory cell as a function of the value of the electric potential of the memory point.

The superposition of the two static characteristics $I_{DS}(V_{DS})$ shown in FIG. 3 shows that the current flowing at the memory point 110 is stable at two points referenced 60 and 62 in FIG. 3. The difference between the values of these two stable points 60 and 62 is equal to the value $V_{DD\_CELL}-V_{SS}$, i.e., the supply voltage of the two TFET storage transistors 106 and 108. At the point referenced 60, which corresponds to the case where the value of the potential $V_{110}$ is substantially equal to that of the potential $V_{SS}$, the potential $V_{110}$ is stable because the bump 58 formed by the characteristic $I_{DS}(V_{DS})$ of the second TFET storage transistor 108 keeps the potential $V_{110}$ at that value if the latter tends to increase and the negative differential resistance phenomenon that appears for the characteristic $I_{DS}(V_{DS})$ of the first TFET storage transistor 106 for values below $V_{SS}$ also maintains that value of the potential $V_{110}$ if the latter tends to decrease. Likewise, at the point referenced 62 that corresponds to the case where the value of the potential $V_{110}$ is substantially equal to that of the potential $V_{DD\_CELL}$, the potential $V_{110}$ is stable because the bump 54 formed by the characteristic $I_{DS}(V_{DS})$ of the first TFET storage transistor 106 keeps the potential $V_{110}$ at that value if the latter tends to decrease and the negative differential resistance phenomenon that appears for the characteristic $I_{DS}(V_{DS})$ of the second TFET storage transistor 108 for values greater than $V_{DD\_CELL}$ also maintains that value of the potential $V_{110}$ if the latter tends to increase. A bit in state "0" can therefore be stored in the memory cell 100 by setting the value of the potential $V_{110}$ at the value of the point referenced 60, i.e., the value of $V_{SS}$, for example approximately 0 V, and a bit in state "1" can be stored in the memory cell 100 by setting the value of the potential $V_{110}$ at the value of the point referenced 62, i.e., the value of $V_{DD\_CELLS}$ for example approximately 0.6 V.

A region 64 located between the two bumps 54 and 58 is considered to be an undetermined region regarding the state of the bit stored by the cell 100. Indeed, if the value of the potential $V_{110}$ is, in this region 64, for example at a value comprised between approximately 0.2 V and 0.4 V when $V_{SS}$=0 V and $V_{DD\_CELL}$=0.6 V, it is not possible to find the value of this potential again, because it may vary within that region 64, the memory cell 100 in that case being considered to be in a high impedance state. To store a bit in state "0" or "1", the value of the potential $V_{110}$ is therefore not set in the range of values corresponding to that region 64.

At the storage points 60 and 62, the value of the current flowing at the memory point 110 corresponds to the current $I_{DS1}$ and $I_{DS2}$ crossing through the two TFET storage transistors 106 and 108 and therefore depends on the structure of the TFET storage transistors 106 and 108 used in the memory cell 100. The TFET storage transistors 106 and 108 used are preferably such that the value of this current is low at the storage points 60 and 62, and for example comprised between approximately 10 fA/μm and 10 pA/μm (value of the current per μm of channel width), which allows the memory cell 100 to consume little current when the latter is in a state storing a value of a bit.

The difference between the values of the potentials $V_{DD\_CELL}$ and $V_{SS}$ can be lower than the second value of the characteristics $I_{DS}(V_{DS})$ of the TFET storage transistors 106 and 108, for example below approximately 0.6 V, while obtaining a stability of the state of the stored bit, the region 64 in that case being smaller than in the example of FIG. 2. It is in particular possible for this difference to be such that the bumps 54 and 58 of the characteristics $I_{DS}(V_{DS})$ of the TFET storage transistors 106 and 108 become superimposed, the region 64 in that case being able to be nonexistent.

As previously explained in connection with FIG. 2, the maximum value of the current $I_{DS}$ at the bumps 54 and 58 depends on the structure of the TFET storage transistors 106 and 108, but also on the values of the potentials of $V_{GG1}$ and $V_{GG2}$ applied on the gates of the TFET storage transistors 106 and 108. To ensure the best possible stability of the memory cell 100, the values of the potentials of $V_{GG1}$ and $V_{GG2}$ are preferably chosen to be as large as possible, for example at least equal to $V_{DD\_CELL}$, to have the highest possible ratio between the value of the current at the storage points 60 and 62 and the maximum values of the bumps, that ratio for example being comprised between approximately $10^3$ and $10^7$.

The read and write speed in the memory cell 100 depends in part on the supply voltage $V_{DD\_CELL}-V_{SS}$, which will preferably be chosen to be as large as possible so that the memory cell 100 is as fast as possible. The TFET storage transistors 106 and 108 are therefore preferably made such that they accept the highest possible polarization voltage. However, this voltage should preferably be chosen such that the memory cell 100 is compatible with other CMOS circuits, preferably between approximately 0.3 V and 1V.

In the embodiment previously described, the TFET storage transistors 106 and 108 are made from silicon, i.e., include source, drain and channel regions made from silicon. Alternatively, one of the TFET storage transistors 106 and 108 or both TFET storage transistors 106 and 108 can have a heterojunction, i.e., include source and drain regions made with different semiconductors, for example germanium source regions and silicon drain regions.

It is also possible for the TFET storage transistors 106 and 108 both to be of type p. In this case, the drain of the first TFET storage transistor 106 is connected to the second power supply terminal 104 and the source of the first TFET storage transistor 106 is connected to the drain of the second TFET storage transistor 108 while forming the memory point 110. The source of the second TFET storage transistor 108 is connected to the first power supply terminal 102. Furthermore, the potential $V_{GG1}$ applied on the gate of the first TFET storage transistor 106 is negative or zero in this case, and the potential $V_{GG2}$ applied on the gate of the second TFET storage transistor 108 is less than or equal to approximately −0.6 V.

Thus, when the stored bit is in state "0", the first TFET storage transistor 106 is inversely polarized with a positive voltage $V_{DS}$, for example equal to 0.6 V, and the second TFET storage transistor 108 is polarized with a substantially zero voltage $V_{DS}$. Conversely, when the stored bit is in state "1", the first TFET storage transistor 106 is polarized with a substantially zero voltage $V_{DS}$ and the second TFET storage transistor 108 is inversely polarized with a positive voltage $V_{DS}$, for example equal to 0.6 V. The properties of the memory cell 100 previously described with two n-type TFET storage transistors are therefore also found in this configuration of the memory cell 100, which includes two p-type TFET storage transistors.

It is also possible for both TFET storage transistors 106 and 108 to be of different conductivity types relative to one another.

It is for example possible for the first TFET storage transistor 106 to be of type n and the second TFET storage transistor 108 to be of type p. In this case, the source of the first TFET storage transistor 106 is connected to the second power supply terminal 104 and the drain of the first TFET storage transistor 106 is connected to the drain of the second TFET storage transistor 108 while forming the memory point 110. The source of the second TFET storage transistor 108 is connected to the first power supply terminal 102. The potential $V_{GG2}$ applied on the gate of the second TFET storage transistor 108 is in this case negative or zero, and the potential $V_{GG1}$ applied on the gate of the first TFET storage transistor 106 is greater than or equal to approximately 0.6 V.

Thus, when the stored bit is in state "0", the first TFET storage transistor 106 is inversely polarized with a negative voltage $V_{DS}$, for example equal to −0.6 V, and the second TFET storage transistor 108 is polarized with a substantially zero voltage $V_{DS}$. Conversely, when the stored bit is in state "1", the first TFET storage transistor 106 is polarized with a substantially zero voltage $V_{DS}$ and the second TFET storage transistor 108 is polarized inversely with a positive voltage $V_{DS}$, for example equal to 0.6 V. The properties of the memory cell 100 previously described with two n-type TFET storage transistors are therefore also found in this configuration of the memory cell 100, which includes two TFET storage transistors of opposite types.

It is also possible for the first TFET storage transistor 106 to be of type p and the second TFET storage transistor 108 to be of type n. In this case, the drain of the first TFET storage transistor 106 is connected to the second power supply terminal 104 and the source of the first TFET storage transistor 106 is connected to the source of the second TFET storage transistor 108 while forming the memory point 110. The drain of the second TFET storage transistor 108 is connected to the first power supply terminal 102. The potential $V_{GG1}$ applied on the gate of the first TFET storage transistor 106 is in this case negative or zero, and the potential $V_{GG2}$ applied on the gate of the second TFET storage transistor 108 is greater than or equal to approximately 0.6 V.

Thus, when the stored bit is in state "0", the first TFET storage transistor 106 is inversely polarized with a positive voltage $V_{DS}$, for example equal to 0.6 V, and the second TFET storage transistor 108 is polarized with a substantially zero voltage $V_{DS}$. Conversely, when the stored bit is in state "1", the first TFET storage transistor 106 is polarized with a substantially zero voltage $V_{DS}$ and the second TFET storage transistor 108 is polarized inversely with a negative voltage $V_{DS}$, for example equal to −0.6 V. The properties of the memory cell 100 previously described with two n-type TFET storage transistors are therefore also found in this configuration of the memory cell 100, which includes two TFET storage transistors of opposite types.

Relative to a memory cell including a bistable element formed by two inverters mounted head-to-tail, the use of the two TFET storage transistors 106 and 108 makes it possible to achieve reading approximately 6.5 times faster, while using a lower power supply voltage and writing twice as quickly.

Aside from the two TFET storage transistors 106 and 108 performing the storage function of the memory cell 100, this memory cell 100 includes a write port 112, allowing the writing of a value of a bit at the memory point 110, and a read port 114 allowing the reading of the value of the stored bit at the memory point 110.

The write port 112 includes a MOS write transistor 116 of type p or n, whereof a first electrode, corresponding to the source or the drain, is connected to the memory point 110 and whereof a second electrode, respectively corresponding to the drain or the source, is connected to a write bit line (or BLW for "Bit Line Write") 118. The gate of the MOS write transistor 116 is connected to a write word line (or WLW for "Word Line Write") 120.

The MOS write transistor 116 forms a write access transistor of the memory cell 100. The writing of a bit in the memory cell 100 is triggered via the application of a write command signal, for example in the form of a pulse whose amplitude is equal to an electric potential $V_{DD}$ that is for example equal to twice $V_{DD\_CELL}$, for example approximately 1.2 V, on the gate of the MOS write transistor 116, via the write word line 120, making the MOS write transistor 116 on during the pulse duration. During this write operation, a data signal corresponding to the bit to be stored is found on the write bit line 118, this data signal for example corresponding to a potential greater than or equal to $V_{DD}$ for a bit in state "1" and less than or equal to $V_{SS}$ (0 V) for a bit in state "0". Because the MOS write transistor 116 is in the on state during this write operation, an electric potential is applied on the memory point 110, that potential for example being equal to 0.6 V in the case of a bit in state "1" (the voltage $V_{DS}$ across the terminals of the MOS write transistor 116 for example being equal to approximately 0.6 V) and 0 V in the case of a bit in state "0". The value of this electric potential applied on the memory point 110 corresponds to the value of one of the two storage points 60 and 62 of the memory cell 100 as previously described. The write operation is completed by transitioning the electric potential applied on the gate of the MOS write transistor 116 to 0 V, thereby blocking the MOS write transistor 116. The value of the electric potential applied on the memory point 110 during the period where the MOS write transistor 116 is on is stored in the memory cell 100 owing to the two TFET storage transistors 106 and 108, which keep the electric potential as previously described owing to the characteristics $I_{DS}(V_{DS})$ of these two inversely polarized transistors.

The read port 114 includes a MOS read transistor 122, for example of type n, whose gate is connected to the memory point 110 and whose source is connected to a third power supply terminal 105 here at the reference potential $V_{SS}$. Polarization means, or a polarization circuit, of the read port 114, not shown in the figures and for example corresponding to means for generating electric voltages or an electric voltage generator, make it possible to apply the desired electric potential on this third power supply terminal 105. The read port 114 also includes a TFET read transistor 124, here of type n, the source of which is connected to the drain of the MOS read transistor 122, the drain of which is connected to a read bit line (or BLR for "Bit Line Read") 126 and the gate of which is connected to a read word line (or WLR for "Word Line Read") 128.

Prior to reading of the bit stored at the memory point 110, the electric potential of the read bit line 126 is pre-charged at $V_{DD}$, for example approximately 1.2 V. The TFET read transistor 124 is next turned on via the application of a read command signal, for example corresponding to a pulse with potential equal to $V_{DD}$, on its gate from the read word line 128. Depending on the value of the bit stored at the memory point 110, the MOS read transistor 122 is on (bit in state "1") or off (bit in state "0"), which leads to a discharge or not of a current from the read bit line 126 through the MOS read transistor 122 and the TFET read transistor 124 depending on the value of the stored bit.

The joint use of the MOS read transistor 122 and the TFET read transistor 124 within the read port 114 allows fast reading of the state of the bit stored in the memory cell 100 (reading able to be done in approximately 1 ns), while having low leak currents at the read port 114.

Figure 4:
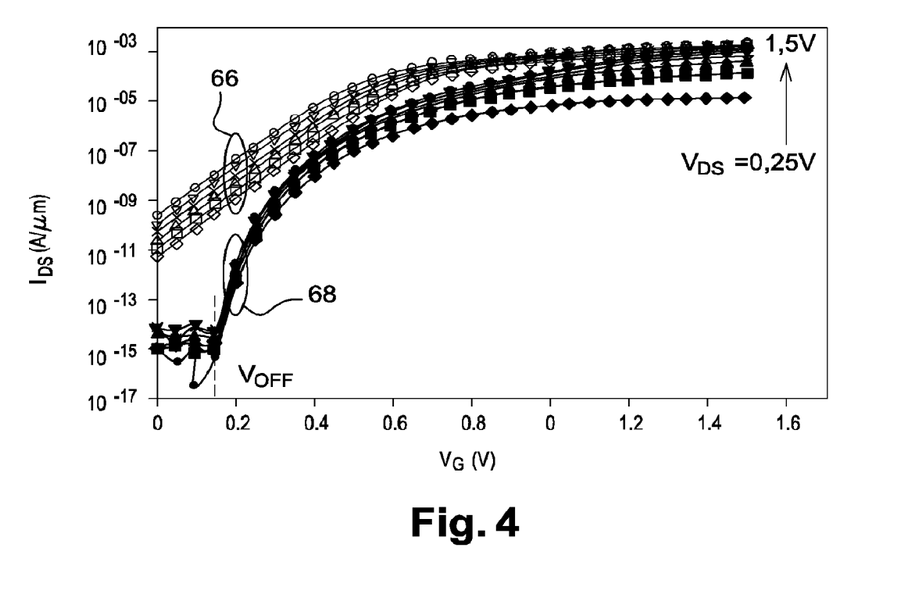
FIG. 4 represents the current $I_{DS}$ as a function of the gate potential $V_G$ in a MOS transistor and in a TFET transistor, for different values of the voltage $V_{DS}$ across the terminals of those transistors.

The curves 66 shown in FIG. 4 correspond to the value of the current $I_{DS}$, in A/µm, as a function of the electric potential $V_G$, in volts, applied on the gate of a transistor of the NMOS type, for a voltage $V_{DS}$ from 0.25 V to 1.5 V. The curves 68 show the value of the current $I_{DS}$ as a function of the electric potential $V_G$ applied on the gate of an n-type TFET transistor, for a voltage $V_{DS}$ from 0.25 V to 1.5 V. These curves clearly illustrate that for given values of $V_{DS}$ and $V_G$, the value of the current $I_{off}$ of a TFET transistor in the blocked state is significantly lower than that of the current $I_{off}$ of a MOS transistor in the blocked state. Furthermore, at a given $V_{DS}$ and $V_G$, the value of the current $I_{on}$ of a TFET transistor in the on state is also slightly lower than that of the current $I_{on}$ of a MOS transistor in the on state. Thus, the presence of the TFET read transistor 124 in the path going from the read bit line 126 to the third power supply terminal 105 makes it possible to greatly reduce the leak currents relative to the case of a read port only including MOS transistors. In the example described here, the leak currents are less than approximately 10 fA/µm. This reduction in the leak currents therefore results in a reduction of the electricity consumption of the memory cell 100.

Figure 5:
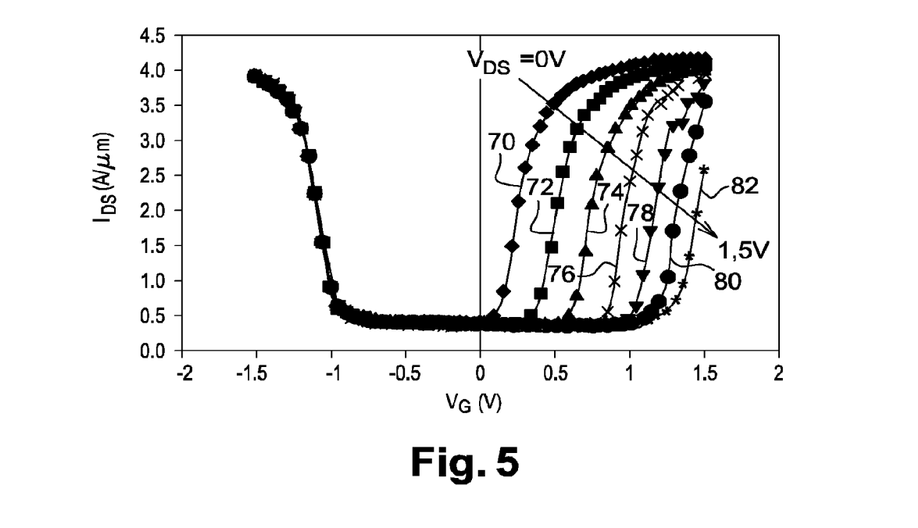
FIG. 5 shows the total gate capacity of a TFET transistor as a function of the gate potential $V_G$, for different values of the voltage $V_{DS}$ across the terminals of the transistor.

The curves 70 to 82 shown in FIG. 5 correspond to the value of the total gate capacity (sum of the different capacities in the transistor), in fF/µm as a function of the potential $V_G$, in volts, applied on the gate of an n-type TFET transistor, for a voltage $V_{DS}$ going from 0 V to 1.5 V (curve 70: $V_{DS}$=0 V; curve 72: $V_{DS}$=0.25 V; curve 74: $V_{DS}$=0.5 V; curve 76: $V_{DS}$=0.75 V; curve 78: $V_{DS}$=1 V; curve 80: $V_{DS}$=1.25 V; curve 82: $V_{DS}$=1.5 V). These curves illustrate the fact that for a given value of $V_G$, the value of this capacity decreases when the voltage $V_{DS}$ increases. Furthermore, the value of this capacity for a MOS transistor is greater than that of the TFET transistor, for given values of $V_G$ and $V_{DS}$. Thus, the low capacity of the TFET read transistor 124 contributes to the reduction of the leak currents through the elements of the read port 114. Furthermore, the low capacity of the TFET read transistor 124 does not harm the read speed relative to a read port made up only of MOS transistors, and further makes it possible to obtain a read speed higher than that of a read port formed only by TFET transistors. This is in particular due to the low capacity obtained between the read bit line 126 and the read word line 128 owing to the TFET read transistor 124. Furthermore, the fact that the potential of the read bit line 126 is pre-charged at $V_{DD}$ increases the value of the voltage $V_{DS}$ across the terminals of the TFET read transistor 124, which reduces the value of the capacity seen from the read bit line 126.

The table below indicates, for different MOS/TFET combinations of the transistors 122 and 124, the discharge speeds obtained on a read bit line 126 with a capacity equal to 30 fF during reading of a bit, as well as the current leaks measured at these transistors in the case of a stored bit in state "1" (case where the leak currents are greatest).

| Transistors | Discharge speed BLR (mV/ns) | Leak current |
|---|---|---|
| 122:MOS-124:MOS | 140 | 5.36 pA |
| 122:MOS-124:TFET | 110 | <1fA |
| 122:TFET-124:MOS | 40 | <1fA |
| 122:TFET-124:TFET | 30 | <1fA |

A reading of a bit can be done from a discharge of approximately 200 mV, or even less, for example 100 mV.

This table illustrates that the configuration of the read port 114 with the MOS read transistor 122 and the TFET read transistor 124 represents the best configuration in terms of read speed and leak currents.

The memory cell 100 of FIG. 1 corresponds to a memory cell with 5 TFET/MOS transistors. The MOS transistors 116 and 122 are for example made using 32 nm technology. The read bit lines 118 and the write bit lines 126 for example each have a capacity equal to approximately 30 fF.

When the two TFET storage transistors 106 and 108 are of type n, the potential $V_{GG1}$ applied on the gate of the first TFET storage transistor 106 is for example equal to 1.2 V and that of the potential $V_{GG2}$ applied on the gate of the second TFET storage transistor 108 is for example equal to 0.6 V. Thus, the first TFET storage transistor 106 operates with a constant voltage $V_{GS1}$ of 0.6 V irrespective of the value of the bit stored in the memory cell 100, and the second TFET storage transistor 108 operates with a voltage $V_{GS2}$ equal to 0.6 V when a bit in state "0" is stored at the memory point 100 and equal to 0 V when a bit in state "1" is stored.

Likewise, advantageously, when both TFET storage transistors 106 and 108 are of type p, the value of the potential $V_{GG1}$ applied on the gate of the first TFET storage transistor 106 is for example equal to 0 V and that of the potential $V_{GG2}$ applied on the gate of the second TFET storage transistor 108 is for example equal to −0.6 V. When the transistor 106 is of type n and the transistor 108 is of type p, the value of the potential $V_{GG1}$ applied on the gate of the first TFET storage transistor 106 is for example equal to 1.2 V and that of the potential $V_{GG2}$ applied on the gate of the second TFET storage transistor 108 is for example equal to −0.6 V. Lastly, when the transistor 106 is of type p and the transistor 108 is of type n, the value of the potential $V_{GG1}$ applied on the gate of the first TFET storage transistor 106 is for example equal to 0 V and that of the potential $V_{GG2}$ applied on the gate of the second TFET storage transistor 108 is for example equal to 0.6 V.

The table below provides examples of values of electric potentials used in the memory cell 100 during read and write operations, as well as during a storage phase not involving reading or writing in the memory cell 100, and also in a standby mode that makes it possible to limit the current leaks in the memory cell 100 when neither reading or writing is done and a read operation is not imminent.

|  | Read | Write | Storage | Standby |
|---|---|---|---|---|
| WLW | 0 V | 1.2 V | 0 V | 0 V |
| BLW | 0 V | 0 V or 1.2 V | 0 V | 0 V |
| $V_{DD\_CELL}$ | 0.6 V | 0.6 V | 0.6 V | 0.6 V |
| $V_{SS}$ | 0 V | 0 V | 0 V | 0 V |
| WLR | 1.2 V | 0 V | 0 V | 0 V |
| BLR | Floating | 1.2 V | 1.2 V | 0 V |
| $V_{GG1}$ | 1.2 V | 1.2 V | 1.2 V | 1.2 V |
| $V_{GG2}$ | 0.6 V | 0.6 V | 0.6 V | 0.6 V |

In the table above, during a write operation, the value of the BLW potential is at 0 V or 1.2 V depending on the value of the bit to be stored. During a read operation, the value of the BLR potential is considered to be floating because the read bit line 126 is then disconnected from the power supply pre-charging the potential of the read bit line 126 at $V_{DD}$ and the value of that potential varies depending on the discharge or lack thereof of the current produced during reading of the stored bit. Furthermore, the value of BLR is 1.2 V during a write operation and the storage phase due to the pre-charging of this potential done on the read bit line 126 prior to a read operation.

When a bit in state "0" (0 V) is stored in the memory cell 100, the TFET storage transistors 106 and 108 can have a leak current of approximately 3 fA irrespective of the operation or the mode in which the memory cell 100 is found. When a bit in state "1" (0.6 V) is stored in the memory cell 100, the TFET storage cells 106 and 108 can have a leak current of approximately 187 fA irrespective of the operation or the mode in which the memory cell 100 is found.

The table below provides examples of values regarding the widths W of the different transistors of the memory cell 100 as well as the channel lengths L of those transistors.

| Transistors | W (nm) | L (nm) |
|---|---|---|
| 106 | 100 | 30 |
| 108 | 100 | 30 |
| 116 | 100 | 50 |
| 122 | 150 | 35 |
| 124 | 150 | 30 |

Figure 6:
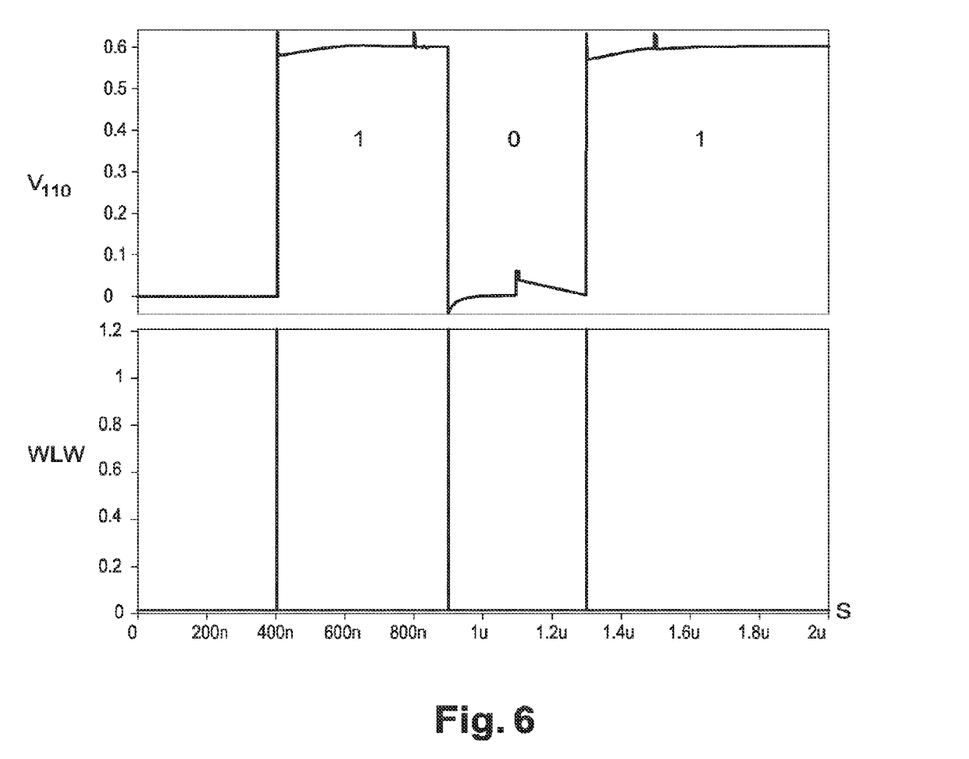
FIG. 6 shows the electric potential of the memory point of a memory cell as well as a write command signal during a write operation of different bits.

FIG. 6 shows the value of the potential $V_{110}$, in volts, at the memory point 110 during a write operation of a first bit in state "1", then of a second bit in state "0", and lastly of a third bit in state "1". The write operations are triggered via the application, on the write word line 120, of pulses with an amplitude equal in value to $V_{DD}$ during a duration of approximately 400 ps, these pulses going from 0 V to $V_{DD}$ and from $V_{DD}$ to 0 V during a duration of approximately 200 ps, that is a total duration of 800 ps per pulse. These pulses are shown below the curve of the potential $V_{110}$. The voltage peaks of the potential $V_{110}$ at times 800 ns, 1.2 μs and 1.5 μs shown in FIG. 6 are due to read operations done at those times, due to the low capacitive coupling formed by the MOS write transistor 122.

The memory cell 100 is generally coupled to other memory cells together forming a memory device allowing the storage of several bits. The memory cells can also be arranged in the form of a matrix, in rows and columns. The write word lines 120 and the read word lines 128 are for example shared by all of the memory cells of a same row of the matrix, and the write bit lines 118 and the read bit lines 126 are for example shared by all of the memory cells of a same column of the matrix.

The fact that the write word lines 120 are shared by all of the memory cells of a same row of the matrix means that a write operation is done simultaneously in all of the memory cells of the row. In order for this not be a drawback, the matrix of memory cells can therefore include a large number of rows and a number of columns limited to the size of the words, i.e., to the number of bits of information to be stored. It is also possible to perform, prior to the write operation, a read operation for the bits stored by the memory cells of the row in which the write operation is designed to be carried out. Thus, when the write operation is implemented to store new bits in only part of the memory cells of the row, the bits previously read in the other memory cells of the row (in which new bits are not designed to be stored) can again be stored in those other memory cells of the row during the write operation. Thus, for these other memory cells, the write operation does not modify the values of the bits stored in those memory cells.

In order to ensure the stability of the storage done by the memory cell 100, the TFET storage transistors 106 and 108 are dimensioned so that the maximum value of the current $I_{DS}$ of these transistors at the "bumps" of their characteristic $I_{DS}(V_{DS})$ is greater than that of the leak current of the MOS write transistor 116, which is approximately one picoampere. It can be advantageous to use a MOS write transistor 116 with a high threshold voltage, i.e., a transistor with a low leak current, also called LP (Low Power) transistor, so that this condition is met, or to adjust the channel widths and lengths of TFET storage transistors 106 and 108. In order to limit the leaks from the MOS write transistor 116, it is also possible, in the standby mode, for the potential of the write bit line 118 to be set at an intermediate value between that corresponding to a bit in state "0" and that corresponding to a bit in state "1", for example approximately 0.3 V.

The write speed in such a memory cell 100 is greater than those obtained in standard SRAM cells of the 6T or 8T type.

Alternatively, the TFET read transistor 124 can be of type p. In that case, the read control signal applied on its gate during a read operation corresponds to a zero or negative electric potential. Furthermore, the source of the TFET read transistor 124 is in that case connected to the read bit line 126 and the drain of the TFET read transistor 124 is connected to the drain of the MOS read transistor 122.

Figure 7:
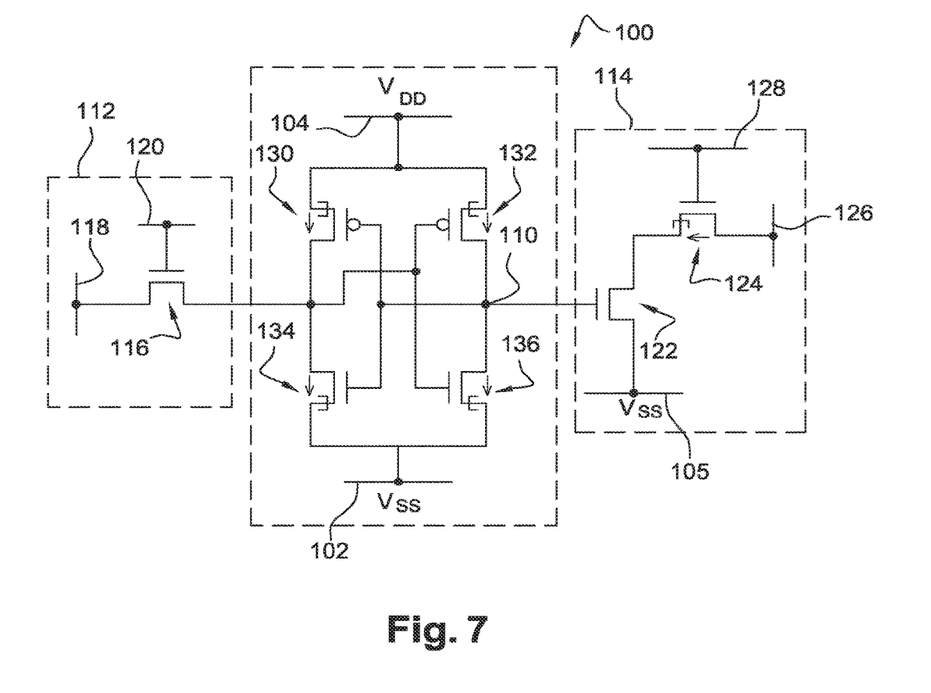
FIG. 7 diagrammatically shows a memory cell according to a second embodiment.

FIG. 7 shows a memory cell 100 according to a second embodiment.

Relative to the first embodiment previously described, the two TFET storage transistors 106 and 108 are replaced by four TFET storage transistors 130, 132, 134 and 136 connected to one another while forming two inverters mounted head-to-tail corresponding to a bistable element, as in document [2] described above.

The gate of the MOS read transistor 122 is connected to the memory point 110, which here corresponds to the connecting point between the drain of the TFET transistor 132 and the drain of the TFET transistor 136, i.e., the input of one of the two inverters of the bistable element. Alternatively, the memory point 110 could correspond to the input of the other of the two inverters, i.e., to the connection point between the drain of the TFET transistor 130 and the drain of the TFET transistor 134.

The advantages provided by the MOS read transistor 122 and the TFET read transistor 124 of the read port 114 of the memory cell 100 according to the first embodiment are also found in the memory cell according to this second embodiment.

According to one alternative, the four storage transistors 130, 132, 134 and 136 may be of the MOS type. Other elements and/or configurations can be considered to produce the storage elements of the memory cell 100.

Figure 8:
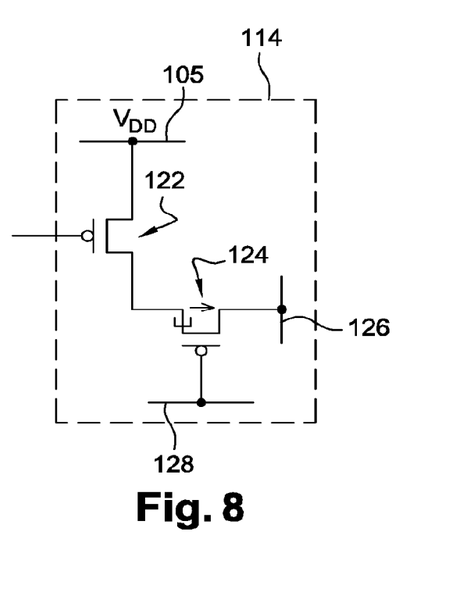
FIGS. 8 to 11 diagrammatically show different alternative embodiments of a read port of a memory cell.

FIG. 8 shows an alternative embodiment of the read port 114 of the memory cell 100. This alternative can apply to the memory cell 100 irrespective of the storage elements of that cell (two TFET storage transistors 106 and 108, four MOS or TFET storage transistors 130, 132, 134 and 136 forming a bistable element, etc.).

In this alternative, the MOS read transistor 122 is of type p and includes its source connected to the third power supply terminal 105 on which the power supply potential $V_{DD}$ is applied, its gate connected to the memory point 110, and its drain connected to the source of the TFET read transistor 124, which here is of type p. The drain of the TFET read transistor 124 is connected to the read bit line 126, and the gate of the TFET read transistor 124 is connected to the read word line 128.

With this read port 114, prior to reading the bit stored at the memory point 110, the electric potential of the read bit line 126 is pre-charged at $V_{SS}$, i.e., 0 V. The TFET read transistor 124 is next turned on via the application of the read control signal (corresponding to a negative electric potential, for example with an amplitude equal to $-V_{DD}$) on its gate from the read word line 128. Irrespective of the value of the bit stored at the memory point 110, the MOS read transistor 122 is on because this transistor is of type p and the electric potential at the memory point 110 is positive or zero. The value of the slope with which the charge of the current from the third power supply terminal 105 through the MOS read transistor 122 and the TFET read transistor 124 occurs depends, however, on the state of the stored bit. The state of the bit stored in the memory cell 100 is therefore deduced from the value of the slope of the current charge occurring in the read port 114, i.e., the duration with which the read bit line 126 reaches a higher potential, for example $V_{SS}$.

The use of a p-type MOS read transistor 122 makes it possible to do away with the constraint related to the minimum value of $V_{DD\_CELL}$ that must be applied on the gate of an n-type MOS read transistor to turn that transistor on as in the embodiments of the read port 114 previously described, during reading of the stored bit. By using a p-type MOS read transistor 122, the value of the stored potential corresponding to a bit in state "1", i.e., $V_{DD\_CELL}$, can be lowered to a value below 0.6 V, for example approximately 0.4 V (for example in that case, with $V_{DD}$=0.8 V).

Such a read port 114 (p-type MOS read transistor 122 coupled to a TFET read transistor 124) has the advantage of allowing faster reading of the bit stored in the memory cell 100 relative to a read port including a first n-type MOS read transistor 122 whose gate is connected to the memory point 110.

When the storage elements of this memory cell 100 correspond to two TFET storage transistors 106 and 108 supplied by the potential $V_{DD\_CELL}$ that is less than $V_{DD}$, and during a read operation, the first p-type MOS read transistor 122 operates at $V_{GS}=V_{DD}$ in the case of reading of a bit in state "0" and $V_{GS}=V_{DD}-V_{DD\_CELL}$ in the case of reading of a bit in state "1". This configuration makes it possible to have a good differentiation between the reading of a bit in state "0" and that of a bit in state "1".

Figure 9:
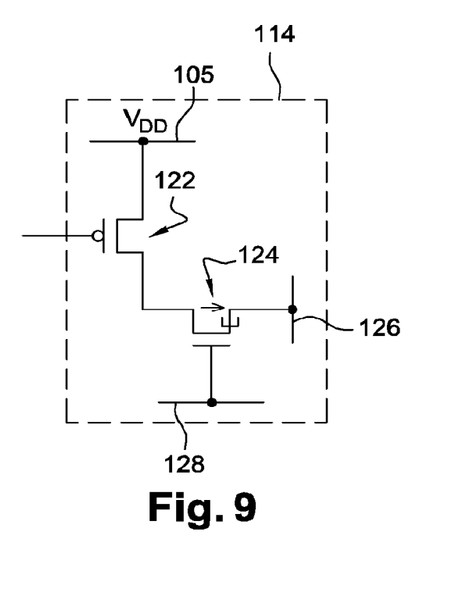

FIG. 9 shows another alternative embodiment of the read port 114 of the memory cell 100. This alternative can apply to the memory cell 100 irrespective of the storage elements of that cell (two TFET storage transistors 106 and 108, four MOS or TFET storage transistors 130, 132, 134 and 136 forming a bistable element, etc.). Relative to the alternative embodiment previously described in relation with FIG. 8, the TFET read transistor 124 here is of type n, and therefore has its source connected to the read bit line 126 and its drain connected to the drain of the MOS read transistor 122. The operation of such a read port 114 is similar to that previously described in relation to FIG. 8, with the exception that the read control signal applied on the gate of the TFET read transistor 124 is positive, for example with an amplitude equal to $V_{DD}$.

Figure 10:
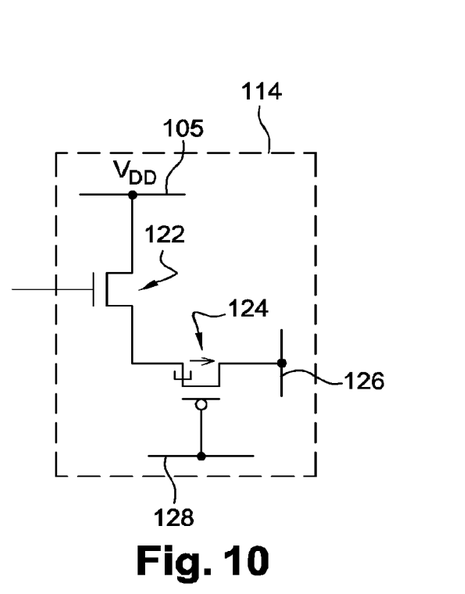

FIG. 10 shows another alternative embodiment of the read port 114 of the memory cell 100. This alternative can apply to the memory cell 100 irrespective of the storage elements of that cell (two TFET storage transistors 106 and 108, four MOS or TFET storage transistors 130, 132, 134 and 136 forming a bistable element, etc.). Relative to the alternative embodiment previously described in connection with FIG. 8, the MOS read transistor 122 here is of type n, and therefore has its drain connected to the third power supply terminal 105 and its source connected to the source of the TFET read transistor 124, which is of type p.

With this read port 114, prior to reading of the bit stored in the memory cell 100, the electric potential of the read bit line 126 is pre-charged at $V_{SS}$, i.e., 0 V. The TFET read transistor 124 is next turned on via the application of the read control signal (negative potential, for example $-V_{DD}$) on its gate from the read word line 128. Depending on the value of the bit stored in the cell 110, the n-type MOS transistor 122 is on (bit in state "1") or off (bit in state "0"). The charge or non-charge of the current from the third power supply terminal 105 through the MOS read transistor 122 and the TFET read transistor 124 therefore occurs depending on the state of the stored bit.

It is also possible that in the read port 114 shown in FIG. 10, the TFET read transistor 124 is not of type p, but of type n.

Figure 11:
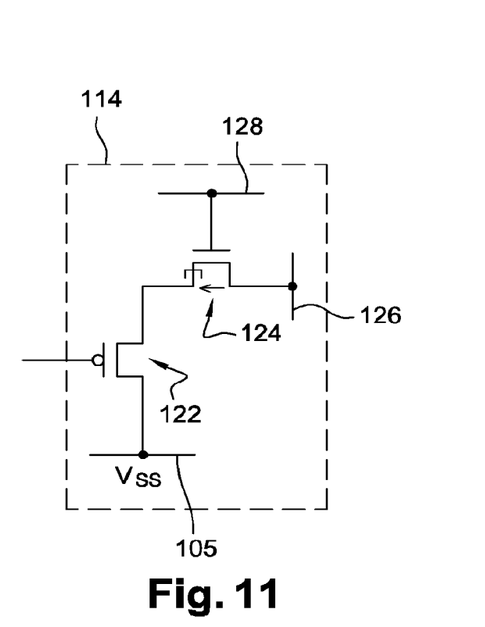

FIG. 11 shows another alternative embodiment of the read port 114 of the memory cell 100. This alternative can apply to the memory cell 100 irrespective of the storage elements of that cell (two TFET storage transistors 106 and 108, four MOS or TFET storage transistors 130, 132, 134 and 136 forming a bistable element, etc.). Relative to the read port previously described in relation to FIG. 1, the MOS read transistor 122 here is of type p, and therefore has its source connected to the source of the TFET read transistor 124, here of type n, and its drain connected to the third power supply terminal 105, which is at potential $V_{SS}$.

With this read port 114, prior to reading of the bit stored in the memory cell 100, the electric potential of the read bit line 126 is pre-charged at $V_{DD}$, for example approximately 1.2 V. The TFET read transistor 124 is next turned on via the application of a read control signal, for example corresponding to a pulse having a potential equal to $V_{DD}$, on its gate from the read word line 128. Because the MOS read transistor 122 is of type p, irrespective of the value of the bit stored at the memory point 110, the MOS read transistor 122 is on. The value of the slope with which the discharge of the current from the read bit line 126 through the TFET read transistor 124 and the MOS read transistor 122 occurs depends, however, on the state of the stored bit. The state of the bit stored in the memory cell 100 is therefore deduced from the value of the slope of the current discharge occurring in the read port 114, i.e., the duration with which the read bit line 126 goes from the potential $V_{DD}$ to a lower potential, for example equal to $V_{SS}$.

It is also possible that in the read port 114 shown in FIG. 11, the TFET read transistor 124 is not of type n, but of type p.

Figure 12:
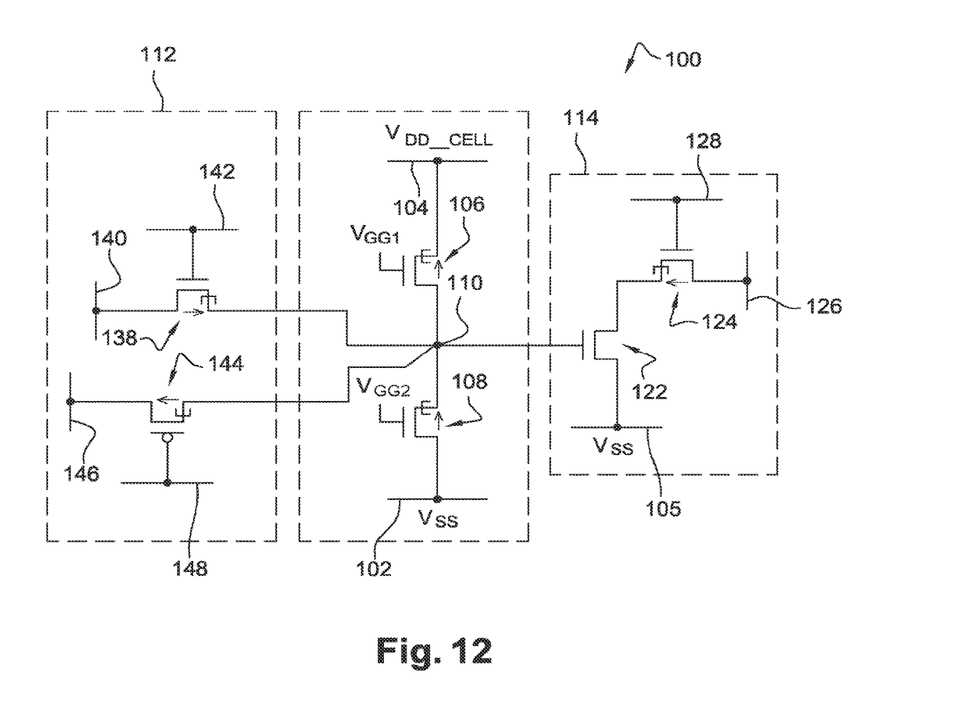
FIG. 12 is a diagrammatic illustration of a memory cell according to a third embodiment.

FIG. 12 shows a memory cell 100 according to a third embodiment.

As in the first embodiment, the storage function is performed by the two TFET storage transistors 106 and 108, here of type n, forming the memory point 110 at the connection between the drain of the first TFET storage transistor 106 and the source of the second TFET storage transistor 108.

Relative to the first embodiment previously described, the write port 112 does not include a single MOS write transistor, but a first n-type TFET write transistor 138 whose source is connected to the memory point 110, whose drain is connected to a first write bit line 140 (BLW1) and whose gate is electrically connected to a first write word line 142 (WLW1), as well as a second p-type TFET write transistor 144 whose source is connected to the memory point 110, whose drain is connected to a second write bit line 146 (BLW0) and whose gate is connected to a second write word line 148 (WLW0).

The first TFET write transistor 138, the first write bit line 140 and the first write word line 142 are dedicated to writing a bit in state "1" at the memory point 110, the second TFET write transistor 144, the second write bit line 146 and the second write word line 148 being dedicated to writing a bit in state "0" at the memory point 110. Depending on the state of the bit to be stored, one of the two TFET write transistors 138 and 144 is put in the on state via a command signal applied on the gate of the corresponding transistor via the corresponding write word line, making one of the two TFET write transistors 138 and 144 on, and thus performs writing of the desired state of the bit at the memory point 110 owing to a data signal on the corresponding write bit line.

The writing of a bit in state "0" is for example done by applying an electric potential equal to $-V_{DD\_CELL}$ (corresponding to the data signal found on the second write bit line 146) on the drain of the second TFET write transistor 144, and by applying electric potential equal to $-V_{DD\_CELL}$ (corresponding to the command signal found on the second write word line 148) on the gate of the second TFET write transistor 144. A negative potential is applied on the gate of the second TFET write transistor 144, which is of type p, so as to have $|V_{GS}|$ greater than approximately 170 mV irrespective of the value stored at the memory point 110 and to have a direct conduction current sufficient for storage of the bit in state "0" at the memory point 110. Furthermore, during storage of a bit in state "0", the data signal on the second write bit line 146 corresponds to a negative electric potential due to the high dependency of the current $I_{DS}$ as a function of $V_{DS}$ in the second TFET write transistor 144, which requires a high value of $V_{DS}$ across the terminals of the second TFET write transistor 144 for rapid discharge of the current at the memory point 110.

The writing of a bit in state "1" is for example done by applying an electric potential equal to $V_{DD}$ (corresponding to the data signal on the first write bit line 140) on the drain of the first TFET write transistor 138, and by applying electric potential equal to $V_{DD}$ (corresponding to the command signal on the first write word line 142) on the gate of the first TFET write transistor 138.

In standby mode, the second write word line 145 applies a potential $V_{DD\_CELL}$ on the gate of the second TFET write transistor 144, which implies that the voltage $V_{GS}$ across the terminals of the second TFET write transistor 144 is zero when a bit in state "1" is stored at the memory point 110 or positive when a bit in state "0" is stored at the memory point 110. In the standby mode, a potential equal to $V_{DD\_CELL}$ can also be applied on the second write bit line 146, which makes it possible to guarantee that even if the second TFET write transistor 144 becomes on, the state of the bit stored at the memory point 110 is not affected because the second TFET write transistor 144 is subject either to a zero voltage $V_{DS}$, or to a negative voltage $V_{DS}$, and such that the inverse current crossing through the second TFET write transistor 144 is negligible.

In this third embodiment, the read port 114 corresponds to that previously described for the first embodiment, but could be done according to any of the alternatives previously described.

In this third embodiment, the gate potentials $V_{GG1}$ and $V_{GG2}$ applied on the gates of the first TFET storage transistor 106 and the second TFET storage transistor 108 are both equal to $V_{DD}$ (approximately 1.2 V). Thus, the first TFET storage transistor 106 operates with a constant voltage $V_{GS1}$ of 0.6 V irrespective of the state of the bit stored in the memory cell 100, and the second TFET storage transistor 108 operates with a voltage $V_{GS2}$ equal to 1.2 V when a bit in state "0" is stored at the memory point 100 and equal to 0.6 V when a bit in state "1" is stored.

The transistors 106, 108, 122 and 124 of this memory cell 100 are for example dimensioned as previously described for the first embodiment, and the TFET write transistors 138 and 144 can have a width for example equal to 100 nm and a length for example equal to 30 nm. The write bit lines 140 and 146 can each have a capacity equal to approximately 30 fF, like the read bit line 126.

The table below provides examples of values of the electric potentials involved in the memory cell 100 according to the third embodiment during a read or write operation, as well as during a storage phase and in standby mode.

|  | Read | Write "0" | Write "1" | Storage | Standby |
|---|---|---|---|---|---|
| WLW1 | 0 V | 1.2 V | 1.2 V | 0 V | 0 V |
| WLW0 | 0.6 V | −0.6 V | −0.6 V | 0.6 V | 0.6 V |
| BLW1 | 0 V | 0 V | 1.2 V | 0 V | 0 V |
| BLW0 | 0.6 V | −0.6 V | 0.6 V | 0.6 V | 0.6 V |
| $V_{DD\_CELL}$ | 0.6 V | 0.6 V | 0.6 V | 0.6 V | 0.6 V |
| $V_{SS}$ | 0 V | 0 V | 0 V | 0 V | 0 V |
| WLR | 1.2 V | 0 V | 0 V | 0 V | 0 V |
| BIR | Floating | 1.2 V | 1.2 V | 1.2 V | 0 V |
| $V_{GG1}$, $V_{GG2}$ | 1.2 V | 1.2 V | 1.2 V | 1.2 V | 1.2 V |

In this third embodiment, the write phases are triggered via the application, on the write word lines 142 and 148, of command signals corresponding to pulses with a total duration of approximately 1 ns per pulse.

As previously described, the memory cell 100 according to the third embodiment is generally coupled to other memory cells in the form of a matrix together forming a memory device allowing the storage of several bits. Relative to the first embodiment, the separation of the write elements of a bit in state "1" and the write elements of a bit in state "0" makes it possible to avoid performing writing in all of the memory cells of the row of the matrix.

The use of two TFET write transistors 138 and 144 to produce the write access of the memory cell 100 has the advantage of providing great stability to the memory cell 100 with respect to variations related to the temperature and lifetime of the cell, and with respect to variations related to the method for producing the cell that is implemented and that can affect the thickness of the channel, the thickness of the oxide, the source doping, the output work of the gate or the positioning of the gate relative to the channel (in particular on the side of the source). Indeed, the current $I_{OFF}$ of a TFET transistor at $V_{GS}$=0 V is not affected by the voltage $V_{DS}$ and approximately several fA at ambient temperature. Increasing the temperature to 115° C. can cause an increase in the current $I_{OFF}$ of the transistor of approximately three decades, in this case in the vicinity of several pA, which remains below the maximum value of the inverse current for negative low voltages $V_{DS}$ as during a storage. Furthermore, the current $I_{OFF}$ of a TFET transistor is not sensitive to variations as long as $V_{OFF}$ is positive. Given that in the memory cell 100, $V_{OFF}$ is approximately 160 mV, the probability of this value becoming negative is very low.

The use of two TFET write transistors 138 and 144 to produce the write access of the memory cell 100 also has the advantage of reducing the current leaks relative to the use of MOS write transistors, these leaks being approximately several fA irrespective of the value of the stored bit, these leaks also not being sensitive to the variations previously indicated.

In the embodiments previously described, the value of the potential stored at the memory point 110 corresponding to a bit in state "1" is approximately 0.6 V so as to be able to make the first n-type MOS read transistor 122 on when a bit in state "1" is stored. This value can, however, be different if the first n-type MOS read transistor 122 can be turned on with a different voltage applied on its gate. The other elements of the memory cell 100 are adapted in this case to the new electric potentials used.

The alternatives previously described in connection with first and second embodiments can also apply to the third embodiment.

The invention claimed is:

1. A memory cell of the SRAM type, including at least:
   storage transistors according to at least one of the TFET or CMOS types, forming a memory point at which a bit is designed to be stored;
   a read port comprising a) at least one MOS read transistor, b) a TFET read transistor, c) a power supply terminal, and d) a read bit line,
   wherein
   an electric potential of the read bit line is designed to vary depending on the value of the bit stored during a reading of the stored bit,
   the gate of the MOS read transistor is connected to the memory point, and the gate of the TFET read transistor is able to receive a read control signal of the stored bit;
   a first electrode of the MOS read transistor, corresponding to a source or a drain of the MOS read transistor, is connected to the power supply terminal;
   a second electrode of the MOS read transistor, respectively corresponding to the drain or the source of the MOS read transistor, is connected to a first electrode of the TFET read transistor corresponding to a source or a drain of the TFET read transistor;
   a second electrode of the TFET read transistor, respectively corresponding to the drain or the source of the TFET read transistor, is connected to the read bit line.

2. The memory cell according to claim 1, further comprising a circuit for polarization of the read port which applies a reference electric potential on the power supply terminal such that during reading of the stored bit, a read current flows through the TFET read transistor and the MOS read transistor from the read bit line to the power supply terminal, or able to apply a power supply potential on the power supply terminal such that during reading of the stored bit, a read current flows through the MOS read transistor and the TFET read transistor from the power supply terminal to the read bit line.

3. The memory cell according to claim 1, wherein the storage transistors correspond to at least first and second TFET storage transistors connected to one another in series such that a connection between a first electrode of the first TFET storage transistor and a first electrode of the second TFET storage transistor forms the memory point, the first electrode of the first TFET storage transistor corresponding to its drain when the first TFET storage transistor is of type n or to its source when the first TFET storage transistor is of type p, the first electrode of the second TFET storage transistor corresponding to its source when the second TFET storage transistor is of type n or to its drain when the second TFET storage transistor is of type p;

the memory cell further including a circuit for polarization of the first and second TFET storage transistors able to apply, on a second electrode of the second TFET storage transistor, corresponding to its drain when its first electrode corresponds to its source or corresponding to its source when its first electrode corresponds to its drain, and on a second electrode of the first TFET storage transistor, corresponding to its source when its first electrode corresponds to its drain or corresponding to its drain when its first electrode corresponds to its source, different electric potentials and such that irrespective of the value of an electric potential of the memory point, one of the first and second TFET storage transistors is polarized inversely and the other of the first and second TFET storage transistors is polarized with a substantially zero voltage $V_{DS}$.

4. The memory cell according to claim 3, wherein the circuit for polarization of the first and second TFET storage transistors is able to apply, on the second electrode of the second TFET storage transistor, a first electric potential with a value substantially equal to a first value of the electric potential of the memory point corresponding to a state "0" of the bit, and to apply, on the second electrode of the first TFET storage transistor, a second electric potential with a value substantially equal to a second value of the electric potential of the memory point corresponding to a state "1" of the bit.

5. The memory cell according to claim 4, wherein the value of the first electric potential is equal to approximately 0 V, and/or the value of the second electric potential is between approximately 0.3 V and 1 V.

6. The memory cell according to claim 4, wherein 1) the circuit for polarization of the first and second TFET storage transistors and 2) the first and second TFET storage transistors are configured such that, when the value of the electric potential of the memory point is equal to that of the first electric potential, a value of a current $I_{DS1}$ crossing through the first TFET storage transistor is between approximately 1 fA/µm and 10 pA/µm and such that, when the value of the electric potential of the me point is equal to that of the second electric potential, a value of a current $I_{DS2}$ crossing through the second TFET storage transistor is between approximately 1 fA/µm and 10 pA/µm.

7. The memory cell according to claim 4, wherein the circuit for polarization of the first and second TFET storage transistors is able to apply an electric potential $V_{GG1}$ on the gate of the first TFET storage transistor and an electric potential $V_{GG2}$ on the gate of the second TFET storage transistor such that:

when the first and second TFET storage transistors are of type n, the values of the electric potentials $V_{GG1}$ and $V_{GG2}$ are greater than or equal to those of the second electric potential;

when the first TFET storage transistor is of type n and the second TFET storage transistor is of type p, the value of the electric potential $V_{GG1}$ is greater than or equal to that of the second electric potential, and the value of the electric potential $V_{GG2}$ is less than or equal to 0;

when the first TFET storage transistor is of type p and the second TFET storage transistor is of type n, the value of the electric potential $V_{GG1}$ is less than or equal to 0 and the value of the electric potential $V_{GG2}$ is greater than or equal to that of the second electric potential;

when the two TFET storage transistors are of type p, the value of the electric potential $V_{GG1}$ is less than or equal to 0 and the value of the electric potential $V_{GG2}$ is less than or equal to the opposite of that of the second electric potential.

8. The memory cell according to claim 1, wherein the storage transistors correspond to at least four transistors according to at least one of the TFET and CMOS types connected to one another while forming a bistable element including two inverters mounted head-to-tail.

9. The memory cell according to claim 1, further including at least one MOS write transistor, whereof a first electrode, corresponding to its source or its drain, is connected to the memory point, whereof a second electrode, respectively corresponding to its drain or its source, is able to receive a data signal corresponding to the bit, and a gate of which is able to receive a write command signal in the memory cell.

10. The memory cell according to claim 1, further including at least:

a first TFET write transistor whereof a first electrode, corresponding to its source when the first TFET write transistor is of type n or to its drain when the first TFET write transistor is of type p, is connected to the memory point, whereof a second electrode, corresponding to its drain when the first TFET write transistor is of type n or to its source when the first TFET write transistor is of type p, is able to receive a first data signal with a value corresponding to state "1" of the bit, and the gate of which is able to receive a first write command signal of the state "1" of the bit in the memory cell;

a second TFET write transistor whereof a first electrode, corresponding to its drain when the second TFET write transistor is of type n or to its source when the second TFET write transistor is of type p, is connected to the memory point, whereof a second electrode, corresponding to its source when the second TFET write transistor is of type n or to its drain when the second TFET write transistor is of type p, is able to receive a second data signal with a value corresponding to state "0" of the bit, and the gate of which is able to receive a second write command signal of the state "0" of the bit in the memory cell.

* * * * *